US011550059B2

(12) United States Patent
Lewis

(10) Patent No.: US 11,550,059 B2
(45) Date of Patent: Jan. 10, 2023

(54) THREE-DIMENSIONAL SCANNING LIDAR SYSTEM COMPRISING A RECEIVER CHANNEL PRIMARY COLLECTION LENS AND AN ELECTRONICALLY-CONTROLLABLE MIRROR ARRAY SELECTIVELY DIRECT A DIRECTED PORTION OF REFLECTED SCANNING SIGNAL

(71) Applicant: Garmin Switzerland GmbH, Schaffhausen (CH)

(72) Inventor: Robert A. Lewis, Bend, OR (US)

(73) Assignee: Garmin Switzerland GmbH

( * ) Notice: Subject to any disclaimer, the term of this patent is extended or adjusted under 35 U.S.C. 154(b) by 508 days.

(21) Appl. No.: 16/799,805

(22) Filed: Feb. 24, 2020

(65) Prior Publication Data

US 2020/0271788 A1 Aug. 27, 2020

Related U.S. Application Data

(60) Provisional application No. 62/809,326, filed on Feb. 22, 2019.

(51) Int. Cl.
| G01S 17/894 | (2020.01) |
| G01S 7/481 | (2006.01) |
| G02B 26/08 | (2006.01) |
| H01L 31/107 | (2006.01) |

(52) U.S. Cl.
CPC .......... *G01S 17/894* (2020.01); *G01S 7/4813* (2013.01); *G01S 7/4817* (2013.01); *G02B 26/0858* (2013.01); *H01L 31/107* (2013.01)

(58) Field of Classification Search
CPC . G01S 17/88; G01S 17/89; G01S 7/48; G02B 26/08; G02B 26/10; H01L 31/107
USPC .............................. 250/216, 239, 221, 208.1
See application file for complete search history.

(56) References Cited

U.S. PATENT DOCUMENTS

| 6,137,566 A | 10/2000 | Leonard et al. |
| 6,906,793 B2 | 6/2005 | Bamji et al. |
| 8,125,620 B2 | 2/2012 | Lewis |
| 8,994,925 B2 | 3/2015 | Lewis |
| 9,335,403 B2 | 5/2016 | Lewis |

(Continued)

*Primary Examiner* — Que Tan Le
(74) *Attorney, Agent, or Firm* — Samuel M. Korte; Max M. Ali

(57) ABSTRACT

Techniques are disclosed to enable a system for wide-range scanning of objects in three-dimensions. A broad-beam, laser-based transmitter is provided that is adapted to generate a scanning signal to be transmitted in a scanning direction toward an object to be scanned, a portion of the scanning signal being reflected by the object to be scanned. Additionally, a scanning signal collection lens is provided that is adapted to receive the portion of reflected scanning signal and to direct the reflected scanning signal to a mirror array, the mirror array adapted to selectively direct a directed portion of the reflected scanning signal as well as a detector lens adapted to receive the directed scanning signal, the collection lens adapted to focus the directed scanning signal resulting in a focused directed signal and a photoelectric detector adapted to convert the focused directed scanning signal into at least one electronic representation of a two-dimensional image. A rotational motor is provided that is adapted to rotate the system with respect to the area being scanned.

20 Claims, 11 Drawing Sheets

(56) References Cited

U.S. PATENT DOCUMENTS

| | | |
|---|---|---|
| 9,581,684 B2 | 2/2017 | Lewis |
| 9,658,322 B2 | 5/2017 | Lewis |
| 10,330,780 B2 * | 6/2019 | Hall .................... G01S 7/4811 |
| 2010/0020306 A1 | 1/2010 | Hall |

* cited by examiner

THREE-DIMENSIONAL SCANNING LIDAR SYSTEM COMPRISING A RECEIVER CHANNEL PRIMARY COLLECTION LENS AND AN ELECTRONICALLY-CONTROLLABLE MIRROR ARRAY SELECTIVELY DIRECT A DIRECTED PORTION OF REFLECTED SCANNING SIGNAL

RELATED APPLICATIONS

The current U.S. non-provisional patent application claims priority benefit with regard to all common subject matter of an earlier-filed U.S. provisional patent application titled "3D LIDAR SYSTEM", Application Ser. No. 62/809,326, filed Feb. 22, 2019. The earlier-filed application is hereby incorporated by reference into the current application in its entirety.

BACKGROUND

Traditional methods of scanning objects in three dimensions involve capturing a multitude of two-dimensional images of objects that are moved through space with respect a scanning system or a scanning system that scans from different positions with respect to the object being scanned. Conventional LIDAR scanners have significant rotational inertia preventing them from implementing rapid jumps between scan positions. Unfortunately, most of the range data produced from such a continuous scan pattern is useless because it is acquired staring into blank space or viewing objects out of measurement range.

SUMMARY

Techniques are disclosed to enable a system for wide-range scanning of objects in three-dimensions employing a broad-beam, laser-based transmitter adapted to generate a scanning signal to be transmitted in a scanning direction toward an object to be scanned, a portion of the scanning signal being reflected by the object to be scanned as well as a scanning signal collection lens adapted to receive the portion of reflected scanning signal and to direct the reflected scanning signal to a mirror array, the mirror array adapted to selectively direct a directed portion of the reflected scanning signal to a detector lens adapted to receive the directed scanning signal, the collection lens adapted to focus the directed scanning signal resulting in a focused directed signal. A photoelectric detector is provided that is adapted to convert the focused directed scanning signal into at least one electronic representation of a two-dimensional image. Further, a rotational motor is provided that is adapted to rotate the system with respect to the object to be scanned.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWINGS

The figures described below depict various embodiments of the present invention. It is understood that these figures depict exemplary embodiments. The exemplary features illustrated in the figures are intended to represent these aspects of the various disclosed embodiments and not intended to limit the claimed scope to any particular feature. Further, whenever possible, the following description refers to the reference numerals included in the figures, in which features depicted in multiple figures are designated with consistent reference numerals.

DETAILED DESCRIPTION

Figure 1:
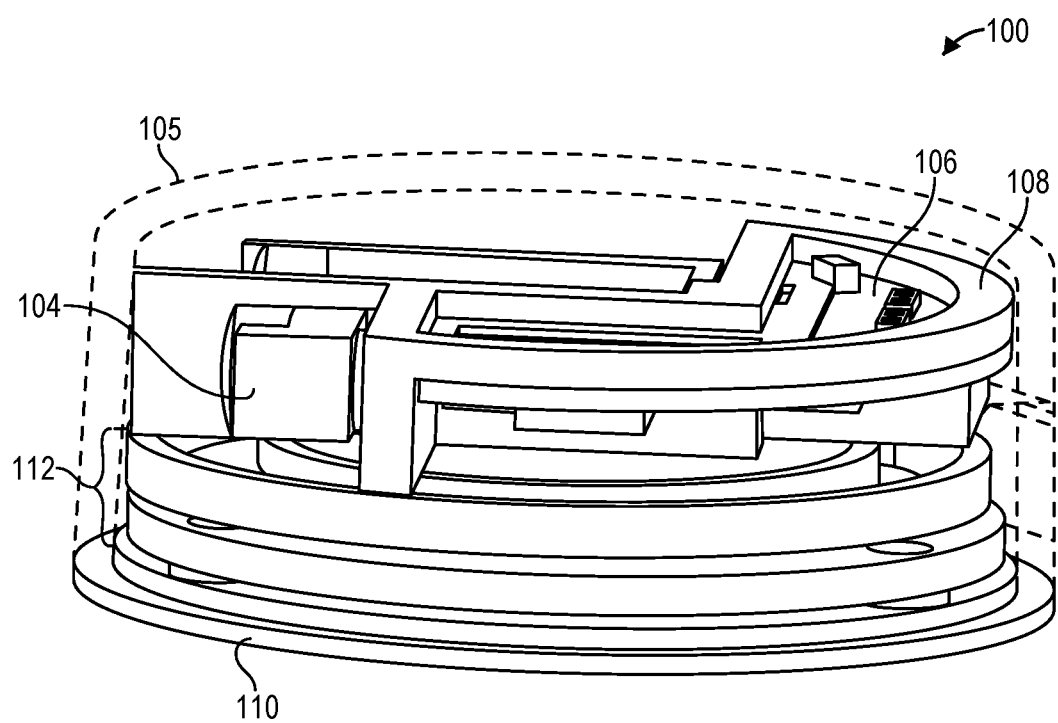
FIG. 1 is a perspective view of an integrated 3D imaging puck consistent with the present teachings.

The following text sets forth a detailed description of numerous different embodiments. However, it is understood that the detailed description is to be construed as exemplary only and does not describe every possible embodiment since describing every possible embodiment would be impractical. In light of the teachings and disclosures herein, numerous alternative embodiments may be implemented.

It is understood that, unless a term is expressly defined in this patent application using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent application.

The following detailed description of the technology references the accompanying drawings that illustrate specific embodiments in which the technology may be practiced. The embodiments are intended to describe aspects of the technology in sufficient detail to enable those skilled in the art to practice the technology. Other embodiments may be utilized and changes may be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology may include a variety of combinations and/or integrations of the embodiments described herein.

Various embodiments apply to the field of non-contact, three-dimensional scanning and imaging. Embodiments of the present teachings can be used in connection with autonomous vehicles, security, 3D imaging, and robotics. LIDAR devices can be rotated to obtain situation awareness. They can be placed on gimbals, rotation platforms or use external steering mirrors. By combining an avalanche photodiode ("APD") receiver incorporating, for example, Texas Instruments MEMS based display technology using arrays of micron scale deflection mirrors, broad beam laser-based transmitter and an ultra-flat piezoelectric motor we can achieve full 360-degree azimuth rotation with 25 degrees of elevation coverage. By limiting azimuth rotation to +/−180, the need to provide isolated power and signal coupling to the rotating internal sensor platform is eliminated. With the size and weight of the rangefinder sensor extremely low, the piezoelectric motor can be integrated into the package with minimal physical overhead.

The flexibility with this technology combined with electronic/mechanical scanning enables the sensor to adapt to a wide variety of system applications requiring either field scanning coverage or object tracking. Field scanning involves sweeping one our more receiver fields over a region or regions of interest. Scanners consistent with the present teachings can adapt scanning patterns to cover a continuous region or using a sparse scan, and they can divide the region into smaller patches of interest while skipping empty areas or objects out of range. Such processing flexibility allows improved long-range operation by increasing the signal integration time at the expense of decreased scan rates, or conversely rapid scanning with lower sensitivity.

Sparse scanning reduces the overall field scanning time and the amount of acquired data. The digital micro-mirror array used to select the receiver field of view can switch between different portions within the illuminated field instantaneously, allowing rapid scanning in either azimuth or elevation assuming the transmit beam covers the receiver field. A conventional rotational scanner optimized for rapid measurement updates over 360-degrees of azimuth coverage has too much rotational inertia to allow it to accelerate or decelerate to observe in detail fixed or slowly shifting regions of interest.

A benefit of the sparse scanning function is the ability to track moving objects by utilizing one or more pixel-clusters from a region around the moving object to resolve its position. The simplest tracking method involves the use of a quadrant cluster of pixels encompassing the object as it moves. The amount of overlap between the spatial extent of the object and the receiver pixels are reflected in the distribution of received signal at each pixel. The distribution of pixel signal strength is used to calculate the objects azimuth and elevation.

In various embodiments, with minimal mechanical and/or optical overhead a variety of transmit fan beam profiles can be selected by a user to allow tailoring the beam to match the desired receiver field of coverage. The beam pattern adjustment can be provided through a manual process using an adjustment screw accessible on the outer housing or through software control through a series of configuration parameters.

Adding elevation scanning adds tremendous utility but also creates a design challenge maintaining a desired small package and low-cost. In various embodiments, to increase elevation scanning capabilities, an elevation gimbal is provided internal to the puck sized package. This however requires greater height to allow the sensor optics and internal housing to pivot along with additional space is required for an actuator or motor. Vertical axis position stability is also reduced in the presence of shock and vibration. In various embodiments, a steering mirror is employed, which has the benefit of having a lower mass and being less venerable to shock. Having such a feature requires folding the optical paths placing the receiver and transmit optical apertures at a significant distance from the centerline of the package.

In configurations, a "big beam" rangefinder is provided using a high-power laser transmitter to illuminate a wide region around a measurement aim point while an electronically scanned receiver maintains a lock on the desired target. In various embodiments, a MEMS based micro-mirror array ("DLP") display is employed, since only a portion of the display is needed for display purposes, making a large portion available for receive signal selection. The approach allocates an unused region of the DLP for illumination of the received signal, and by activating select mirror elements, directs a portion to the receive signal detector.

A benefit of the present teachings is the ability to change from continuous scan coverage to a more efficient sparse scan which bypasses regions that are not of interest. Relevant regions can be identified by using video, radar data or GPS position combined with relational map data. Alternatively, a low-resolution initial scan can be followed by higher resolution scanning over only regions with valid signal returns. A subset of the sparse scan involves tracking one or more objects as they cross the sensor's field-of-view based on initial position information passed from another sensor or by detection of an object crossing a detection boundary.

The DLP mirror array views the full field region illuminated by the laser fan beam generator. With any practical receiver pixel field-of-view, the DLP active region will consist of multiple DLP mirror elements across. In various embodiments, a nominal 10 mrad square field covers 45 mirror elements in azimuth and 26 elements in elevation. With the small angular extent of an individual mirror element, the size of a super-pixel of mirror elements can be reduced as small as a milliradian for high precision three-dimensional imaging and as large as the vertical field of a one of the detector channels of 8 degrees or 140 mrad. One milliradian at fifty meters corresponds to five-cm spatial resolution.

Under bright conditions, the nominal pixel size should be equal or smaller than the nominal 10 mrad field to maintain optimal sensitivity. For continuous scan coverage at distances of 100 meters of more, reducing the receive pixel size (increased resolution) substantially increases vertical scan time. At shorter distances where the nominal vertical scan rate is much faster, increasing the pixel resolution only increases the scan time inversely proportional to the reduction in pixel vertical extent. Since mirror elements can be selected in any order or arrangement(shape) the vertical scan can be configured based on the measurement requirement.

Sparse Scanning

The sparse scan refers to a sensor scan pattern which is constrained to one or more smaller regions contained within the normal full scan field. Scan locations are loaded in by the user and are defined in terms of integer numbers of pixels in elevation and azimuth, right corner location and desired integration count. The pixel size is based on the desired receiver field-of-view required for scanning resolution and solar background conditions. Skipping regions in the scan allows increased scanning rates due to minimizing the number of detection elements. The ability to change the integration count allows region specific dwell times. Closer objects within the scan field with high signal-to-noise ratios allow measurements with only a few transmit bursts allowing quick passage on to the other scan regions. Conversely, weak signal returns or the need to obtain high measurement accuracy, dictate larger integration counts requiring longer field scan times.

Track Scan

If an initial location of an object can be identified, a small cluster of super-pixels can be used to track with high precision the object's movement. Track operation has two modes, target acquisition and tracking. In target acquisition mode, the presence of an object is detected along with determination of its approximate location. Target acquisition may be provided by scanning a region looking for a change meeting a predefined criterion or based on a handoff of a target's location from another sensor i.e. radar, image etc. Once the rough location of an object is determined, a small scanning region around the object can be established to calculate its centroid location. As the object moves, the track field elements follow, maintaining an accurate estimate of location if the object remains generally centered with the region of active pixels.

Target acquisition is generally accomplished by starting with a sparse scan region that the object will cross. The scanning rate must sufficiently fast to catch the object crossing the field with at least one solid detect. If the signal return is weak, the detection region needs to be enlarged to obtain multiple hits to build a track file which can correlate weak return at multiple locations. The scan rate can be increased by decreasing the individual pixel integration time, reducing the signal strength, but allowing multiple hits to build a track file.

FIG. 1 is a perspective view of an integrated three-dimensional imaging puck 100 consistent with the present teachings. In various embodiments, the puck 100 is capable of scanning 360 degrees with a practical range beyond 300 meters. In various embodiments, the puck 100 provides adjustable resolution three-dimensional imaging at distances beyond 100 meters. Accordingly, it is suitable for general applications in robotics and autonomous vehicles, security and traffic management. In various embodiments, a digital light processing ("DLP") mirror array based vertical scanning receiver views a vertical fan transmit illumination matching the extent of desired vertical coverage. In particular applications, a continuous or a sparse scan can be selected, which can skip undesired portions of the field being scanned. The capability for the user to select the size and location of receiver pixels along with the incorporation of a step-based, positional rotation stage, or motor, offers tracking of one or more objects at high update rates. In various embodiments, the receiver pixels can be arbitrarily sized into "superpixels" to achieve a desired field-of view-element as defined by the m-by-n elements of the DLP mirror array.

A high-torque, piezo-motor 112 in combination the rotation platform's low mass and inertia allow millisecond duration jumps between adjacent azimuth locations. Since the transmitted vertically oriented fan beam is wider than the nominal extent of the selected receiver active pixels, the center location of the group of active pixels can be adjusted instantaneously in azimuth (within the extent of the beam) or vertically between transmit bursts to compensate for platform or target movement. The combination of movement based super-pixel tracking and the use of multi-pulse signal processing allowing continuous signal integration and improved signal strength in the presence of movement. Multi-pulse processing passes the top peaks from the correlation record providing a multitude of signal post-processing options.

In various embodiments, the scanning system uses a high-power laser transmitter 104 to produce a long and narrow, vertically-oriented beam with a receiver capable of selecting a small portion for reception and processing. In various embodiments, the vertical fan beam region fills roughly ½ degrees of azimuth and 25 degrees in elevation. In embodiments, the receiver and transmitter are mounted on a piezo-electric motor-based rotation base 110 (such as those described in connection with FIGS. 4 and 5) optionally with +/−180 degrees of rotation to allow full azimuth coverage. Accordingly, an effective field of coverage for the sensor module is 360 degrees of azimuth and 25 degrees of elevation. In various embodiments, the stack of the transmit module and rotation stage are placed within a transparent puck-shaped plastic outer cover 105 to provide environmental protection and to allow unencumbered view for the transmit and receiver apertures. Electronic components associated with the puck 100 are provided in connection with printed circuit board ("PCB") 106, which is supported by sensor frame 108.

Figure 2:
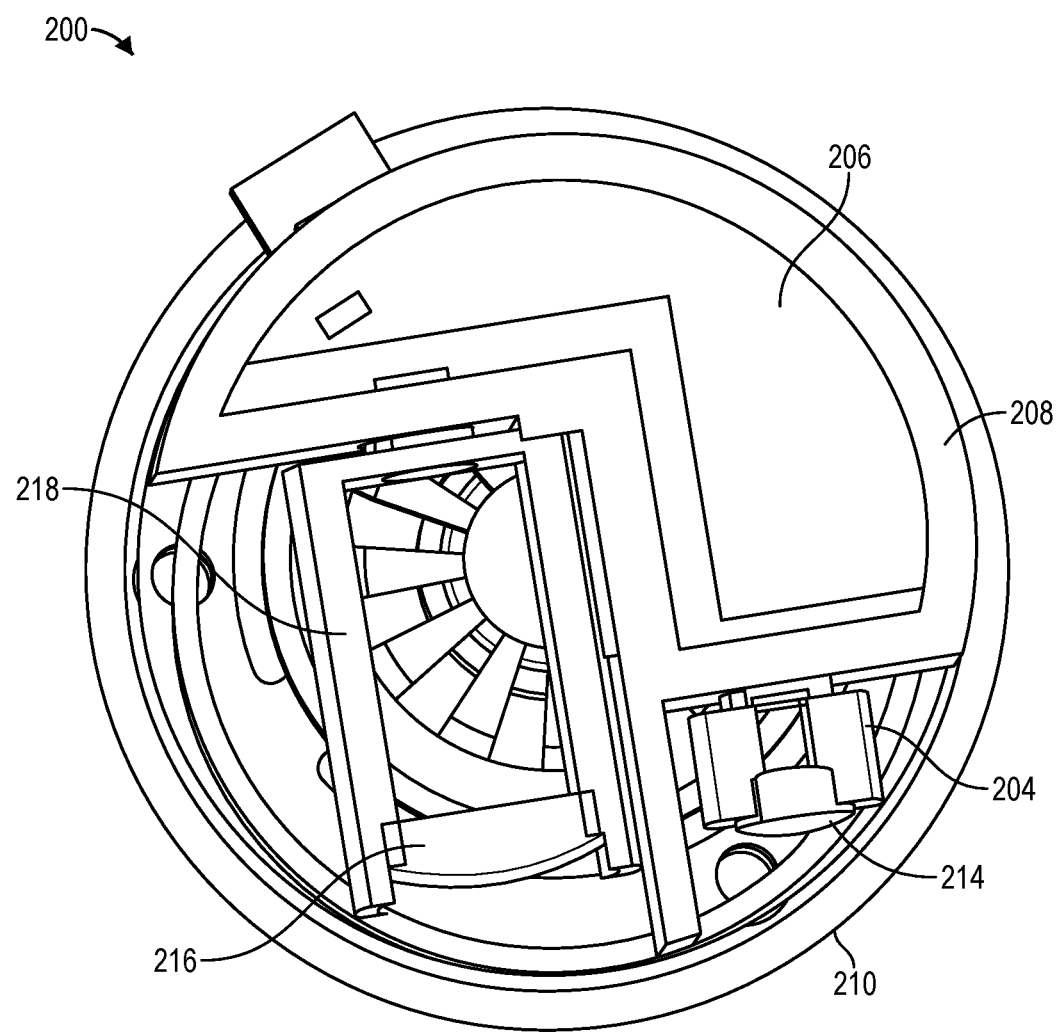
FIG. 2 is a plan view of an integrated 3D imaging puck consistent with the present teachings.

FIG. 2 is a plan view of an integrated three-dimensional imaging puck 200 consistent with the present teachings. In various embodiments, an integrated sensor printed circuit board ("PCB") 206 is provided to integrate and support the electronic components employed in the puck 200. Sensor frame 208 is provided to provide support to components of the puck 200, including the sensor PCB 206. Transmit lens holder 204 is provided to hold and support a transmit lens 214, which is used to focus the light that is transmitted to an object to be scanned. Additionally a receive lens holder 218 is provided to support and hold receive lens 216. Through the receive lens holder 218 can be seen some components of a motor which rotates the puck 200. The motor components are further described below in connection with FIGS. 4 and 5.

Figure 3:
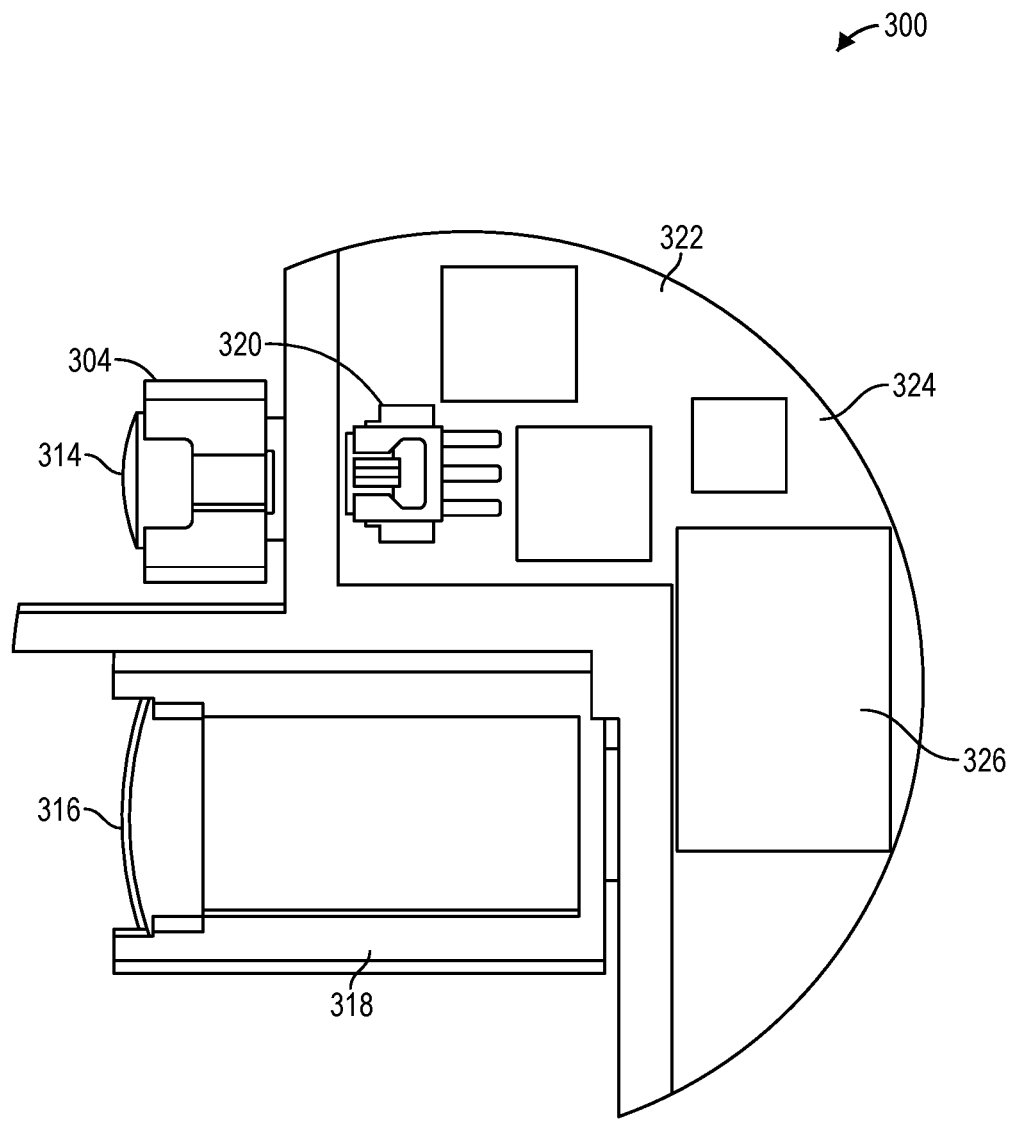
FIG. 3 is an underside view of a sensor platform for an integrated 3D imaging puck consistent with the present teachings.

FIG. 3 is an underside view of a sensor platform 300 for use in connection with an integrated three-dimensional imaging puck consistent with the present teachings. In various embodiments a laser diode 320 is integrated into the sensor PCB 324. Exemplary laser diodes are further described in connection with FIG. 14. Additionally, sensor PCB 324 has integrated further analog and digital circuitry 322 to support the operation of scanners consistent with the present teachings. In various embodiments, an avalanche photodiode ("APD") detector and preamplifier 326 is provided which may be optionally enclosed in a shielded region on the sensor PCB 324. In various embodiments, transmit lens 314 is held and supported by transmit lens holder 304. Further, receive lens 316 is held and supported by receive lens holder 318.

Figure 4:
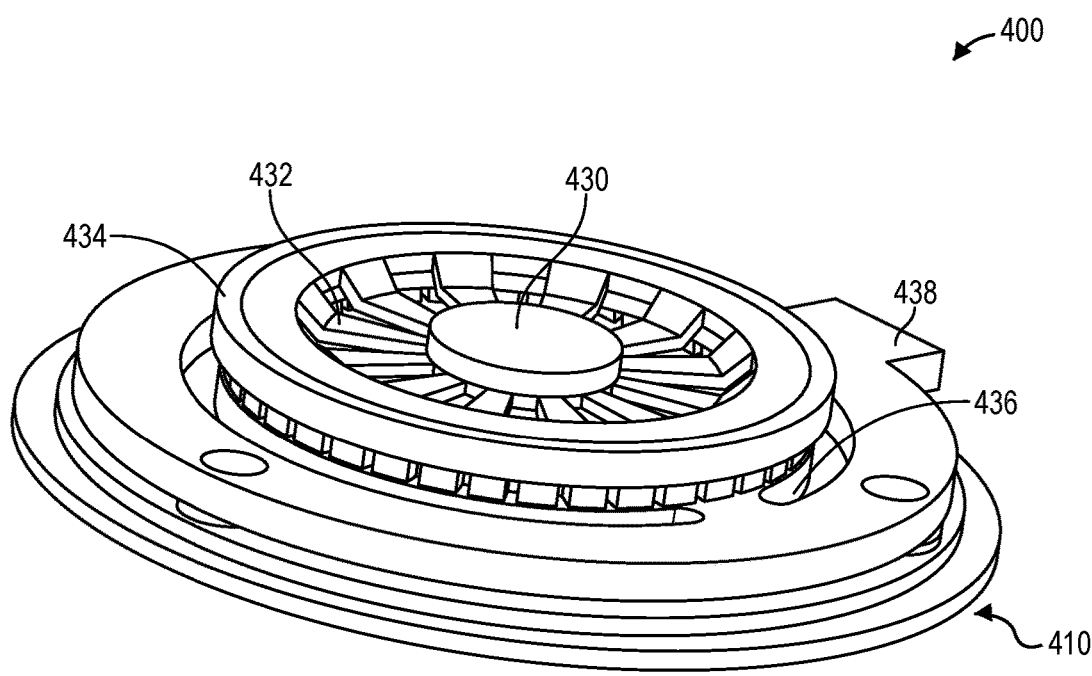
FIGS. 4 and 5 are perspective views of a motor base for an integrated 3D imaging puck consistent with the present teachings.
Figure 5:
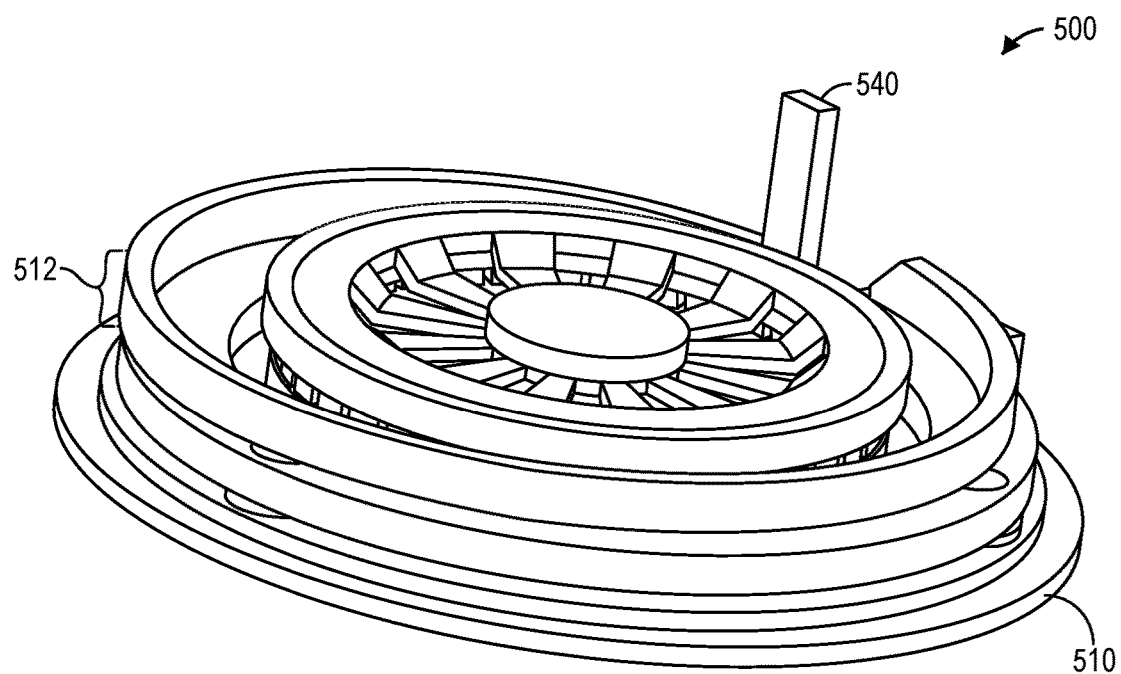

FIGS. 4 and 5 are perspective views of a motor base for an integrated 3D imaging puck consistent with the present teachings. These figures illustrate two aspects of rotating motor bases consistent with the present teachings. In FIG. 4 it can be observed that motor base 410 supports the piezo motor 400, which has a rotation hub and bearing 430 as well as a spring flexure 432 and piezo PCB motor rotor 434. The motor 400 also has a piezo PCM motor stator 438 and additional stator-mounted piezo electric elements 436 which cause the motor rotor 434 to rotate when an electrical signal is applied to the elements 436. FIG. 5 represents a piezo motor stack 512 that makes up the piezo motor 500 and is generally similar to the motor 400 as described in connection with FIG. 4. Additionally, a flex cable 540 is provided that powers the piezo motor 500, allowing it to rotate 180 degrees in either direction.

Figure 6:
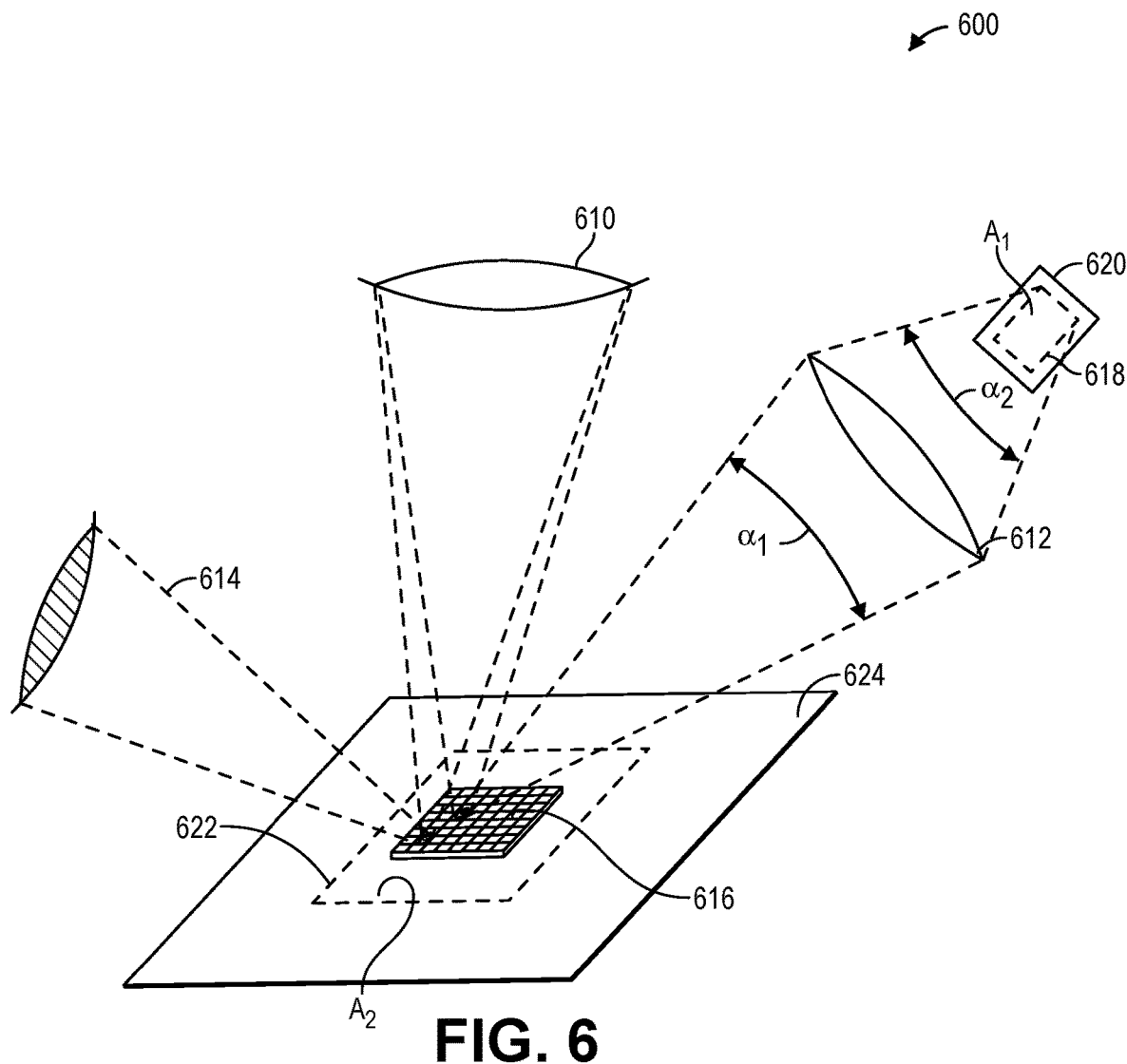
FIG. 6 is a schematic diagram representing the direction of received scanning signal by a mirror array to a detector lens.

FIG. 6 is a schematic diagram 600 representing the direction of received scanning signal by a DLP micro-mirror array 616 to a detector lens 612 and a detector 618. In various embodiments, the mirror array 616 is positioned so that the receiver beam path is focused onto a portion of the mirror array 616. In embodiments, a signal collection and focusing lens 610 is provided to illuminate a dedicated portion of the DLP mirror array. The selection of the tilt state of the mirror array 616 determines whether the energy is dumped (as shown in dumped light 614) or passed onto a receiver detector 618 and focused by detector lens 612. It is understood that the geometry of the mirror elements selected to pass the receive signal define the instantaneous field-of-view of signal receiver and can be square or rectangular of varying size based on system requirements.

In various embodiments, the signal collection lens 610 focuses light on a region of the mirror array 616 designated for receiver field selection. This selected area of the signal region effectively defines an angular field-of-view and is a direct function of the focal length of the receive lens. The effective F-number or light cone angle follows the size of the lens aperture and is designated as $\alpha 1$. The signal region on the DLP has mirror elements which have two angular tilt states. The first "dump" state directs incident light toward the light absorption region to remove light contribution from that portion of the array. The mirror "pass" state directs incoming light towards the detector lens 612, which refocuses the energy onto the receiver detector 618. In embodiments, in order to allow high frequency operation and to minimize system cost, an area associated with the receiver detector 618 is small relative to the mirror array signal selection region. The detector lens 612 is configured to de-magnify the image projected onto the receiver detector 618. To allow demagnification, the cone angle of the incident light for the signal collection and focusing lens 610 needs a relatively high F-number (small light bundle cone angle $\alpha 1$) to allow for cone angle increase when the reduced image is focused onto the receiver detector 620 at area 618 also denoted as area A1. Area A2 represents the signal detection region of the DLP. The brightness theorem dictates that $A1*\alpha 1 = A2*\alpha 2$ based on conservation of energy principles. It is understood that the relation between the angles $\alpha 1$ and $\alpha 2$ are based on the fractional magnification M provided by the detector lens 612.

Figure 7:
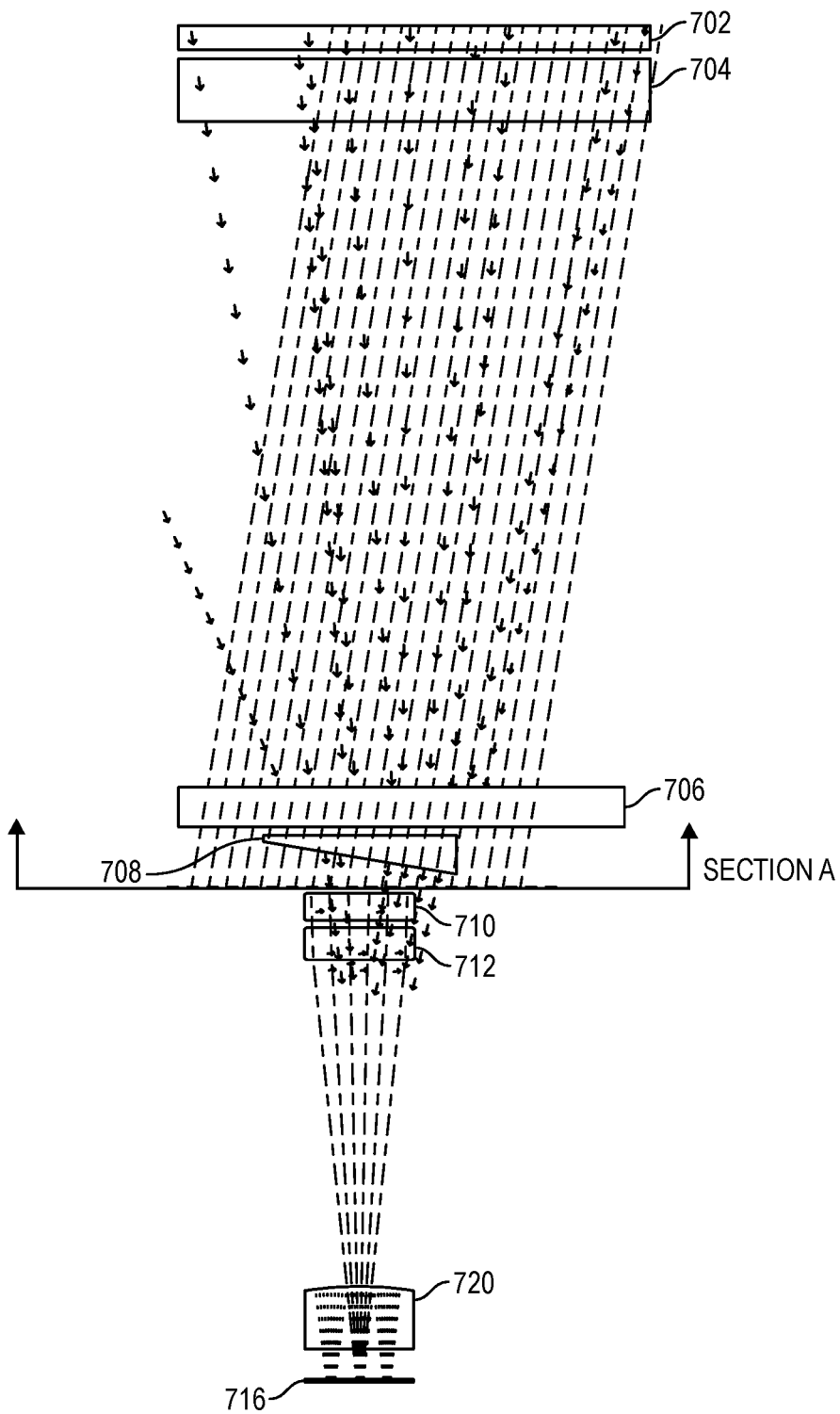
FIG. 7 illustrates an individual receiver selection slice.

FIG. 7 illustrates an individual receiver selection slice, which in this example covers +4 to +12 degrees in elevation. The upper portion contains a cylindrical lens assembly having window 702 and primary cylindrical collection lens 704. In various embodiments, lens 706 is paired to primary lens 704 to provide azimuth magnification (allows an increase in the receive lens size in the azimuth axis) which is shared by the three lower parallel signal selection channels. In various embodiments, lens pair 704 and 706 function as a cylindrical down-collimation lens pair. Once the received signal is magnified in one axis in connection with lenses 704 and 706, the signal is directed by field dissecting prism 708 to one or more receiver optics assemblies as depicted in FIG. 7 below the indicated section line A dividing the prism 708 from lens 710. Receiver lens pair 710 and 712 focus the signal directed by the prism 708 down towards field lens 720 which directs the signal to a portion of the DLP mirror array 716. This figure illustrates a single receiver selection slice. It is set forth below how multiple receiver selection slices can be employed consistent with the present teachings. The upper portion contains a cylindrical lens assembly to provide azimuth magnification (allows an increase in the receive lens size in the azimuth axis) which is shared by the three lower parallel signal selection channels. Window 702 allows light to pass into primary lens 704 which magnifies the signal along the azimuth-axis and signal focusing lenses 710 and 712 and associated mirror array 716, through field lens 720.

Figure 8:
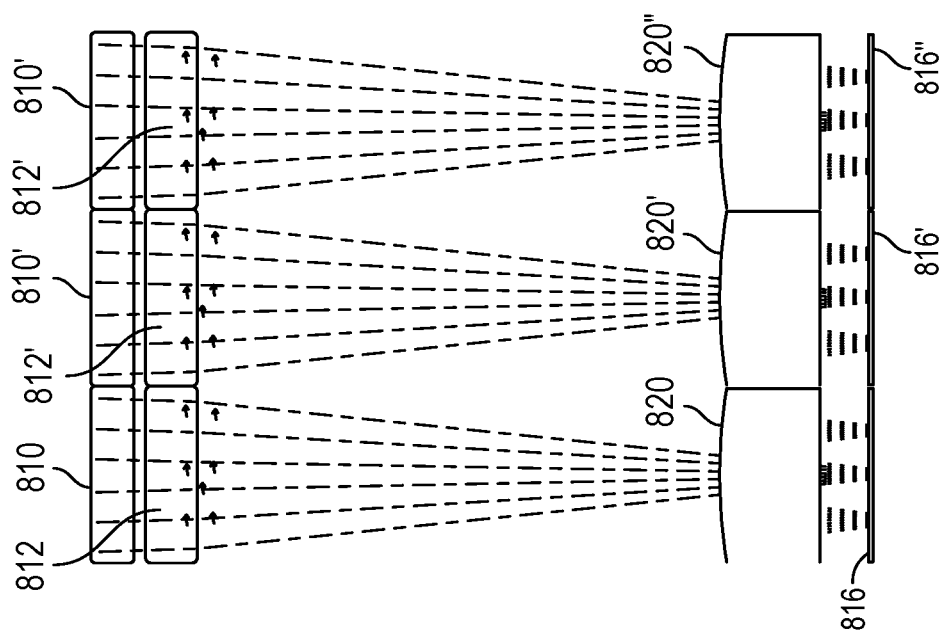
FIG. 8 is a schematic diagram representing direction of the received scanning signal by way of multiple mirror arrays.

FIG. 8 is a schematic diagram representing directing the received scanning signal by way of multiple sections of the DLP mirror array. The sections are denoted 816, 816', and 816". In various embodiments, based on a length-of-signal selection-region on the DLP surface necessary to obtain a desired vertical angular coverage, the vertical field is broken into three, eight-degree signal reception regions, separated by gaps on the array to allow the physical implementation of multiple light bundles incident of the DLP surface. FIG. 8 depicts receiver sections that are sandwiched along the long-axis of the DLP array with a center-to-center separation of, for example, 2 mm. The figure represents the portion of the system below the section A line of FIG. 7. Receiver channel focusing lens pairs 810, 810', 810" and 812, 812', 812" focus the received signal down to field lenses 820, 820' and 820" which parallelizes the light so that it is directed down to the DLP mirror array sections 816, 816', 816", substantially perpendicular to the mirror array.

Figure 9:
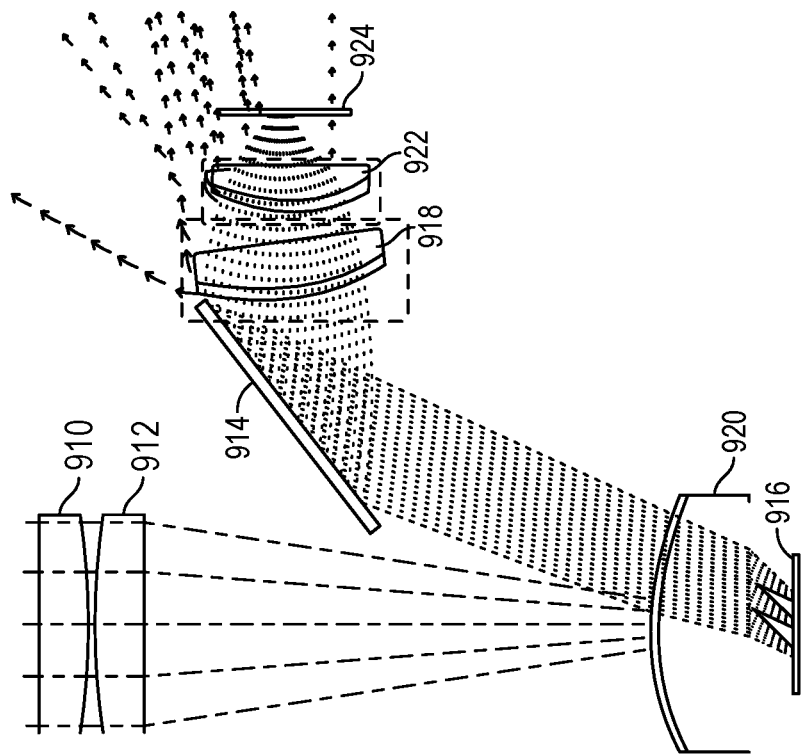
FIG. 9 is a schematic depiction representing direction of the received scanning signal to a detector by way of a secondary redirection mirror.

FIG. 9 is a schematic depiction representing direction of the received scanning signal to a detector by way of a secondary redirection or folding mirror 914. This figure effectively depicts a 90 degree rotated view of FIG. 8 above. FIG. 9 shows one individual receiver selection slice, which in this example covers +4 to +12 degrees in elevation, and it represents the portion of the system, which is located below the section A line of FIG. 7. In addition to directing the selected signal down to the particular section of DLP mirror array 916, the section of the mirror array 916 reflects it up to the folding mirror 914 which then directs the signal to the detector focusing lenses 918 and 922. Finally, the focused signal is received and converted into an image at the detector 924.

Figure 10:
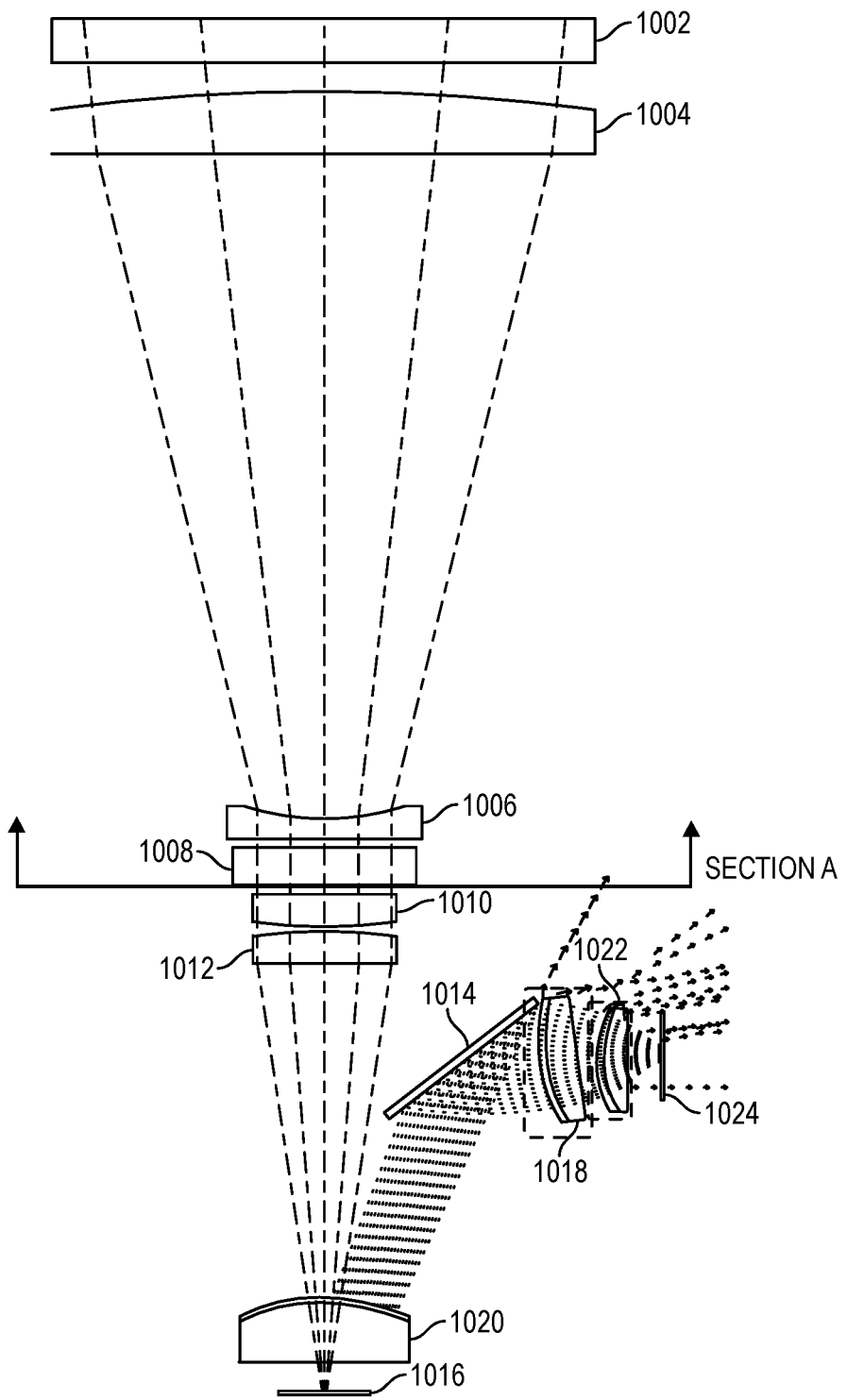
FIG. 10 illustrates an individual receiver selection slice with a folding mirror and associated signal focusing lenses and detector.
Figure 11:
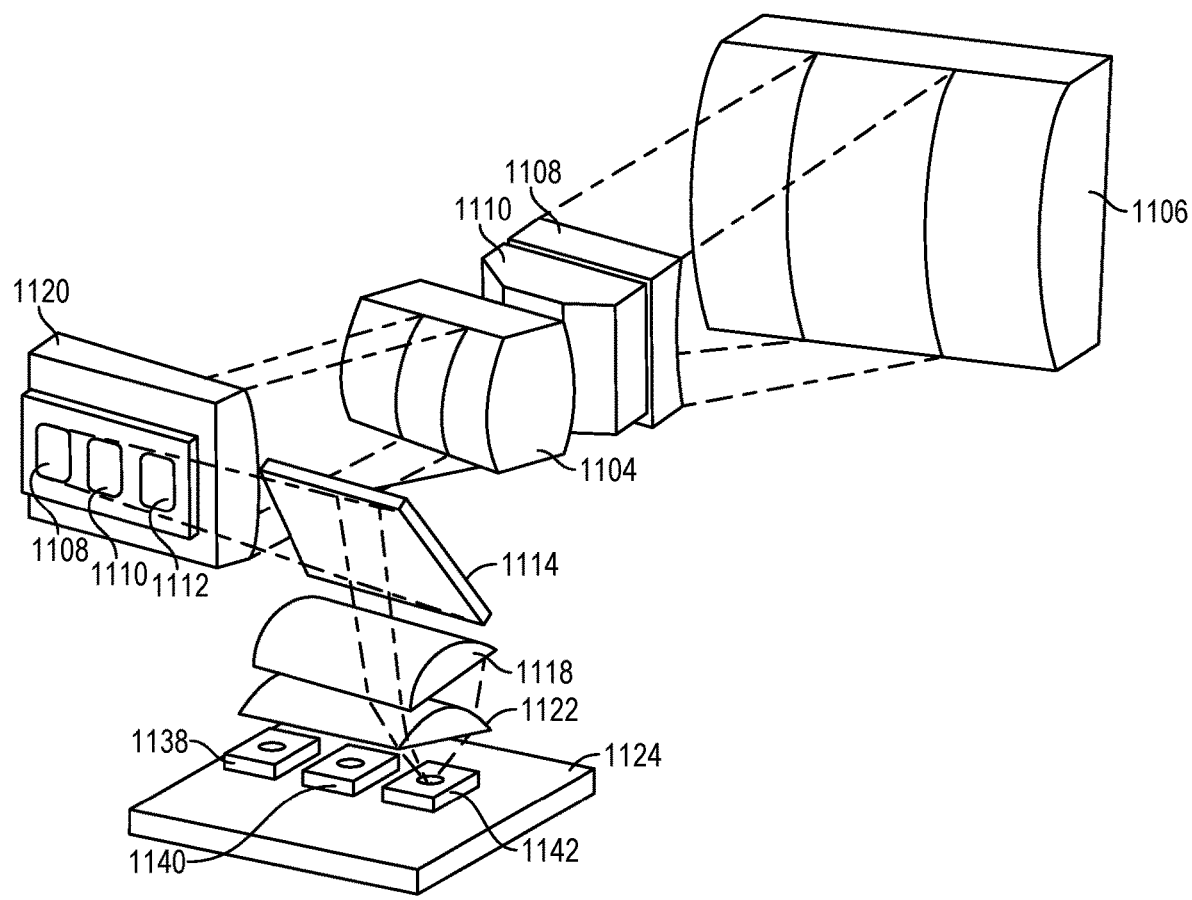
FIG. 11 is an isometric view of a three-dimensional scanning system including receive optics, mirror array and signal detectors.

FIG. 10 illustrates an individual receiver selection slice with a folding mirror and associated signal focusing lenses and detector. Window 1002 lets in light to the receiving channel at primary receiving lens 1004. In various embodiments, in connection with lens 1006, this received signal is down collimated by way of the down collimation lens pair 1004 and 1006. In embodiments having three selection channels, the field dissecting prism 1008 in the lower portion would contain three beam directing facets providing beam angular offsets in elevation of −8, 0, +8 degrees (as shown in FIG. 11), however, in this figure, we illustrate only one of the facets, having an angular elevation of 0 degrees. The beam deflection function is used to steer the desired portion of the vertical field into the acceptance angle the signal selection channel. The receiver channel focusing lenses 1010 and 1012 focus the directed signal and provide it to field lens 1020, which itself directs the light to a portion 1016 of the DLP mirror array. In various embodiments, readily available avalanche photodetectors 1024 suitable for this application come with the detector having a size of approximately 0.5 mm in diameter. Therefore, in various embodiments, the selection slices are chosen around this parameter. Once the light is received at the portion 1016 of the of the DLP mirror array, it is directed towards folding mirror 1014, which further directs the signal to detector lenses 1018 and 1022. Finally the focused signal is received at the detector 1024, which converts the received signal into an image.

FIG. 11 is an isometric view of a three-dimensional scanning system including receive optics, a mirror array, mirror array sections 1138, 1140, and 1142. The vertical and azimuth axes are rotated 90 degrees through the center of the lens axis for simpler illustration. The incoming signal return passes through a first 1106 and a second 1108 cylindrical lens element to provide magnification in the azimuth-axis only. In various embodiments, this also provides a down-collimation function. A field dissecting prism 1110 dissects the vertical-axis into 3-separate vertical fields which pass into 3-signal processing channels. and the DLP field lens 1120 focuses the selected field onto the DLP mirror array surface at an appropriate section 1108, 1110, and 1112. Three roughly rectangular regions drawn on the backside on the field lens 1120 correspond to roughly 1 by 8 degrees (azimuth/elevation) of far-field angle. Selected mirror elements activated to the "pass" state direct the receiver field towards a folding mirror 1114 and then on to a pair of lens elements identified as first and second detector lenses 1118 and 1122. The first detector lens 1118 is tilted to compensate for the tilt in the DLP source mirror element, while the second lens 1122 adds additional field curvature to properly focus on the detector 1124 as shown.

Figure 12:
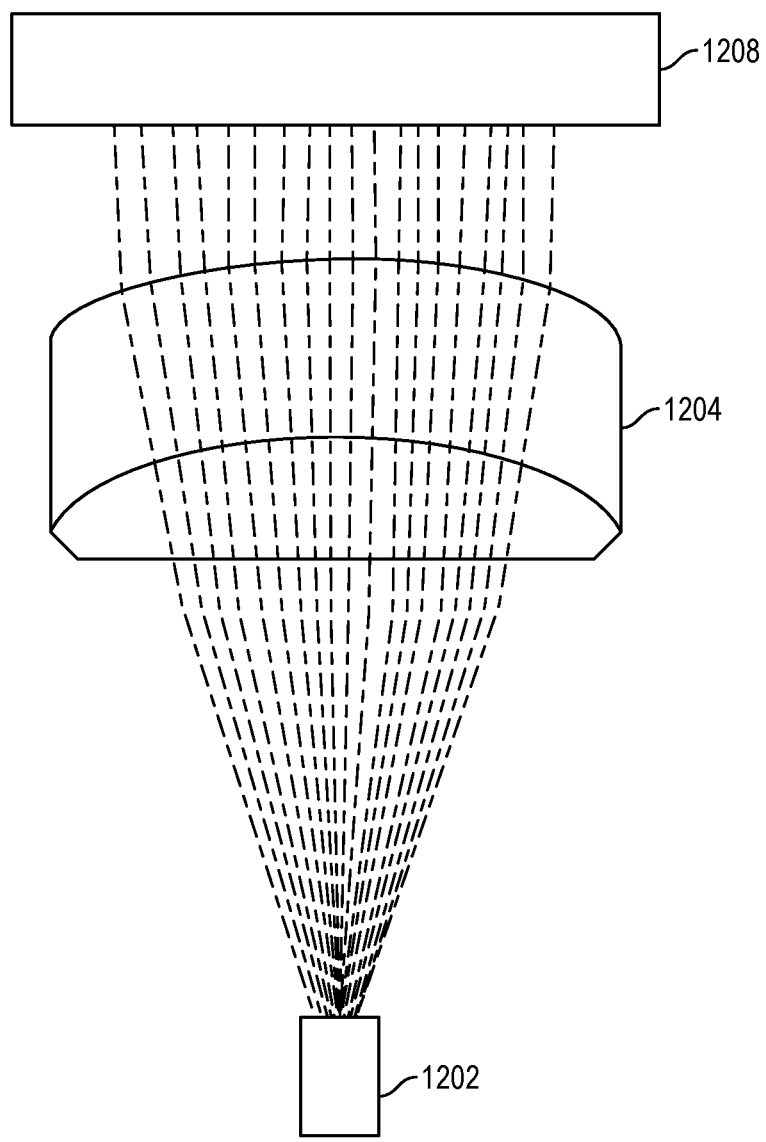
FIG. 12 is a schematic depiction of a transmitted signal from a pulsed laser diode with a laser collimation lens and a beam shaping diffuser.

FIG. 12 is a schematic depiction of a transmitted signal from a pulsed laser diode with a laser collimation lens and a beam shaping diffuser. The laser transmitter consists of a 904 nm pulsed laser diode, laser collimation lens and beam shaping diffuser. I have tentatively chosen a 230 um single stripe pulsed laser with a 20 watts peak output at 30 amps of drive. To obtain good collection efficiency from the +/20-degree narrow-junction axis spread of the laser, a F #1.0, 5 mm focal length condenser lens was chosen. The vertical axis of the outgoing beam is 0.230/5 mrad or 46 mrads (2.5 degrees) with the horizontal axis set to 10 mrad through focus adjustment. An engineering diffuser is used to spread the transmit beam out in the elevation axis to 24-degrees. The figure on the far right show the angular spread characteristics of a representative off-the-shelf 20-degree diffuser from RPC photonics.

Because of the large elevation beam spread and operation at 904 nm the laser's permissible peak power output can be over 100 times stronger than the highly collimated single mode laser used in the Xero and Z80 products. That can allow operation at 35 watts peak or more a remain Class I eye-safe. The figure on the right are examples of low cost, surface mount laser diodes available up to 70-watts peak power at 30 amps of drive.

The selection of transmit beam spread strongly influences ranging system performance. For a given application the ideal vertical extent of the beam is governed the required elevation coverage with the beam width by the largest desired size of the pixel. If a pixel's size is smaller than the extent of the target, narrowing the spread of the beam, increases the power density at the target, and with all else equal (same range, reflectivity . . . ), reduces the required signal integration count by 1/(change of beam spread)^4. This forth power relationship is valid if the change is defined in terms of an equivalent circular spread. If the change in beam spread is in only one axes, the integration count follows a cubed relationship. If the pixel field-of-view is reduced in conjunction with the transmit beam size, the energy collected per pixel remains constant, resulting in no reduction in the required integration count. If a receiver pixel field-of-view is larger than a viewed object, then reducing the beam and receiver pixel size results in increases signal strength, improving required scan dwell time and angular resolution.

Ideally the transmitter beam should be tuned to application requirements. A transmit beam adjustment capability can be provided by giving user a selection of application specific beam diffusers. Giving the user access to the inner assembly might be the least costly option using snap-in diffuser optics. Unfortunately, this could have laser safety implications and reduce the environmental integrity of the outer housing. A more desirable solution could place an actuated diffuser optic in front of the outgoing beam to provide a series of beam spread options. A succession of beam spread facets within a diffuser when moved relative to the transmit lens, would allow the changing the beam shape and spread. Since the inner sensor assembly rotates relative to the fixed outer housing, momentary anchoring of the diffuser to the outer housing would allow relative positioning. Rotating the inner housing while holding the diffuser fixed, would allow different diffuser facets could be used. Once set to a desired diffuser facet, the diffuser would rotate with the inner assembly.

The diffuser position relative to the transmit aperture within the inner housing could be changed by a breaking mechanism between the diffuser, stiction bearing anchored to the inner housing, and the outer housing. Once the diffuser is anchored, the inner rotation platform would be actuated move the relative position of the diffuser. The mechanical break could be a manually actuated screw or button on the outer housing or use a linear or rotational actuator. Alternatively, if the azimuth rotation angle can be limited to something less the +/−180 degrees, a mechanical stop mounted to the outer housing could be used to slide the diffuser to different positions when the rotation angle exceeds +/−180 degrees.

Figure 13:
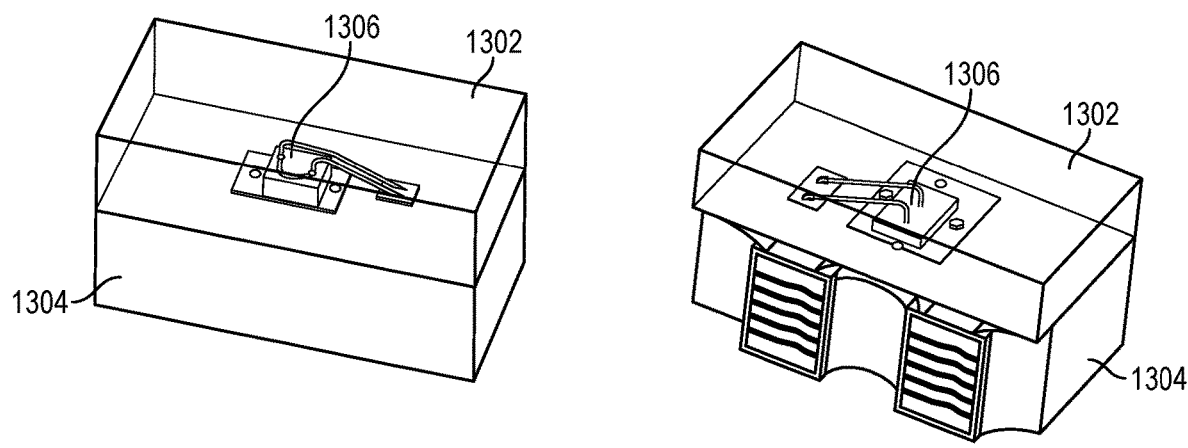
FIG. 13 is a schematic depiction of surface mount laser diodes consistent with the present teachings.

FIG. 13 is a schematic depiction of surface mount laser diodes consistent with the present teachings. In various embodiments, surface mount 905 nm pulsed semiconductor lasers are employed to provide the transmit laser signal. Such pulsed semiconductor lasers emitting light at 905 nm in the near IR, using a multi-layer monolithic chip design. In various embodiments, the laser diode is mounted on a glass-reinforced epoxy laminate material substrate leadless laminate carrier 1304. Laser components 1306 generate a laser signal that is projected through substantially transparent cover 1302.

Figure 14:
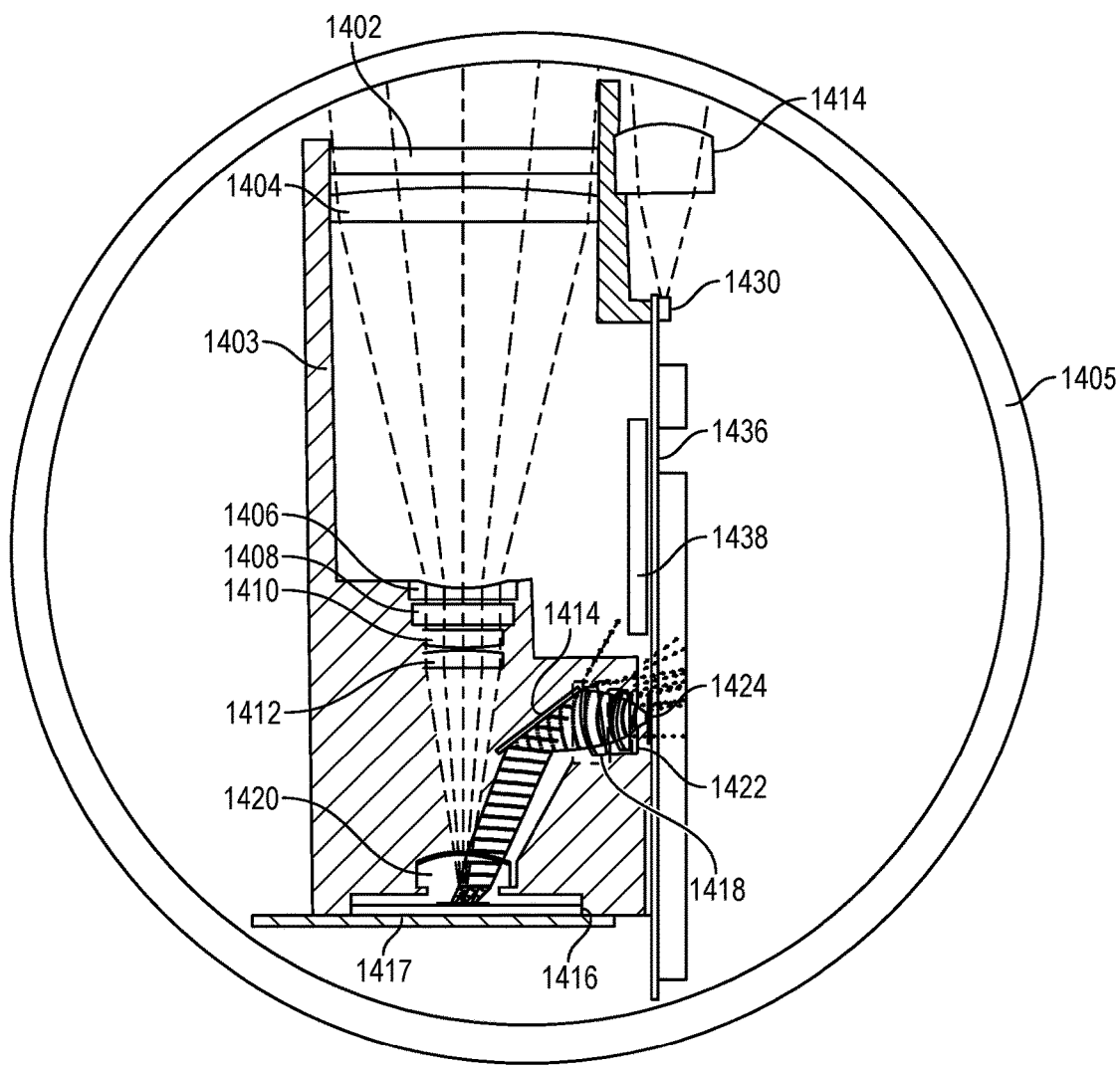
FIG. 14 is a cross-section view of a three-dimensional scanner consistent with the present teachings.

FIG. 14 is a cross-section view of a three-dimensional scanner consistent with the present teachings. The figure below shows the sensor engine contained within the cylindrical outer cover, or environmental enclosure 1405. The inner sensor frame, or support structure 1403 contains side-by-side transmit and receiver optics with narrow axis of a primary PCB 1436 oriented vertically and its long-axis parallel to the line-of sight. In various embodiments, the transmit lens 1414 is roughly 1-by-1 cm with the collector lens less than 5-by-5 mm square. Mounted on the main PCB of pixels during object track. The design option was selected to have the fan beam spread settings to be manually set by the user at set-up or selectable during operation.

TABLE 1

| Application | Fan Beam Spread | Target Size | Integ. Count | Scan Field Coverage | Az. Scan Rate | El. Scan Rate | Field Rate | Range |
|---|---|---|---|---|---|---|---|---|
| #1 - Long range Scans (large building or geographic feature) | .57° Az 2.3° El | 13 m Sq. | 512 | 2.3° Az.- 2.3° El. | 2.7 deg/sec | 11 deg/sec | 1.2 Hz | 1200 m |
| #2 - Long range Scans | .57° Az 2.3° El | 1 m² Sq. | 512 | 2.3° Az.- 2.3° El. | 2.7 deg/sec | 11 deg/sec | 1.2 Hz | 340 m |
| #3 - Long range Scans | .57° Az 8° El | 1 m² Sq. | 16 | 8° Az. 8° El. | 25 deg/sec | 356 deg/sec | 3 Hz | 206 m |
| #3 - Long range Scans | .57° Az 24° El | 1 m² Sq. | 2 | 24° Az. 24° El. | 200 deg/sec | 8500 deg/sec | 8 Hz | 92 m |
| #4 - Base Ball Detect (stationary vertical scan) | .57° Az 8° El | .0036 m² | 1 | .57° Az 8° El | 0 | 5700 deg/sec | 700 Hz | 20 m |
| #5 - Base Ball Track (Switch to 5 mrad by 5 mrad pixel) | .57° Az 8° El | .0036 m² | 1 | +/−60° Az 8° El | 720 deg/sec | 2850 deg/sec | 2500 Hz | 30 m | are three detector and preamp channels covered by a common shield. A 9 mm square FPGA 1438 contains three high-speed parallel correlator channels to allow for a maximal processing rate. It is understood that by processing images of the object to be scanned in parallel (in this case three at a time) the scanning processing will be approximately three times as fast. A microcontroller and laser driver are also located on the main PCB. The receiver path and housing are shown on the left side of the illustration. In various embodiments, a DLP mirror array 1416 and associated support PCB 1417 are mounted to back side of the inner sensor support structure. A signal is transmitted from laser diode 1430 through the transmit lens 1414 and towards the object to be scanned. Portions of that signal are reflected by the object to be scanned and sent back towards the receive channel, where the signal passes through window 1402 and into lens pair 1404 and 1406 where, in various embodiments, the signal is down collimated and sent to receiver channel focusing lenses 1410 and 1412. In various embodiments, as explained in connection with FIGS. 8-11 a field dissecting prism 1408 is provided that diverts its selected portion of signal to an appropriate portion of the associated DLP mirror array 1416 The portion of the DLP mirror array 1416 then steers the signal to folding mirror 1414, through the detector lenses 1418 and 1422 and to a detector 1424.

Application Example Details

To illustrate the flexibility to address a wide range of system applications, a series of scanning and signal processing scenarios are evaluated. Four different long ranging scanning examples are analyzed to show how the system parameters transmit beam spread and signal integration count can be adjusted to address a larger scanning area of coverage along with higher measurement update rates. A sparse scan and object tracking example is based on a hypothetical requirement of tracking the trajectory of a baseball.

The following table summarizes the analysis of a variety of scanning and tracking scenarios for the sensor. The analysis details are shown in the Application Example Details section below. In all cases except example #6, the default pixel FOV is set to 10 mrad by 10 mrad or 0.57 degrees square. In the 6th case, the pixel FOV is narrowed to allow transmit fan beam coverage of a two-by-two group In one example, a narrow beam rangefinder is incorporated on a rotational platform contained within a sealed housing. A long range APD/Laser based range finding engine is used to increase range and measurement update rate over conventional LIDAR sensors. The internal sensor housing and optics are designed for integration into the small diameter envelope of the rational stage and the low-profile nature of the piezo-electric motor enables the thin package. Limiting azimuth rotation to +/−180 degrees eliminates the normal communications and power rotary joint to reduce cost, complexity and to improve reliability.

Supporting analysis for the Scan and Track Summary Table (Table 1) above is detailed in the following six examples. The calculations are based on extrapolation of baseline test data taken during initial testing of an exemplary system based on the present teachings. The extrapolations are based on radiometric principles. These calculations are consistent with results obtained using system performance modeling.

First, assume transmit power is divided based on the energy collected within an individual field-of-view of a pixel. Radiometric calculations consider two target size cases: the target is larger than the pixel field-of-view and the case of a smaller target. If the target is larger, the signal reduction with distance follows the inverse square law and range scales with: (i) the square-root of change in transmit power; (ii) proportional with the scaling of the receiver aperture; (iii) the 4th-root of signal integration count; and (iv) the square-root of change in target reflectivity. Alternatively, if the target is made smaller than the pixel, range scales with: (i) the square-root of change in target size; and (ii) the 6th-root of signal integration count.

Scanner System Assumptions

For these examples, transmit power was selected to be 20 W and minimum beam Spread: 10 by 40 mrads. Receiver effective aperture was selected to be 5 mm and receiver field-of-view to be 1 by 24 degrees divided into 3 8-degree signal collection channels. Nominal pixel size was chosen to be 10 mrad square field for front-end dominated noise performance under bright background conditions.

Example #1—Long range minimum beam size, maximum integration time, large target.

The minimum beam size is limited by the divergence of the beam prior to the diffuser. The laser is focused to achieve the desired azimuth axis divergence which is 10 mrad. The elevation axis is limited by laser selection and lens focal length which in this case is 40 mrad. For simplicity, the calculation is based on the target being larger than the pixel field-of-view. The result is then scaled to the smaller target.

Baseline: 15-meters range @ (0.35 Watts, 230 um detector, 512 integration count, 90% reflective target)

The scaled power is 20 W/4 pixels or 5 W per pixel FOV. The Effective system: (5 W, 5000 um detector, 512 integration count, 90% reflective) solve for count. Range scales with the square root of power, and linearly with effective receiver aperture. Range=sqrt (5/0.35)*(5000/230)*15=1232 meters.

Example #2—Long range minimum beam size, maximum integration time, $1m^2$ target—At this long range the target would have to be more than 13 meters square. If the target is smaller than the receiver field-of-view range scales proportionally to the fourth root of the change in signal strength and the signal strength varies with the square of the change in distance.

Delta Range=(Delta Reflected Signal)¼ and

Delta Reflected Signal=(Delta Target Size)2 thus Delta Range=(Delta Target Size)½This assumes Delta Target Size is the linear dimension of square target.

Thus, the maximum range with a large can be scaled by the ratio of the target sizes.

The Maximum range with a 1-meter target is thus 1232*sqrt (1/13)=341 meters

Based on a maximum integration count, we obtain a 20 Hz pixel scan rate and assuming a 40 mrad vertical field, we obtain a roughly 1 Hz scan rate for an entire field of 40 by 40 mrad.

Example #3—Long range scan, 8-degree vertical field.

It is assumed the sensor has the approximate location of a target travelling within a region 8 degrees azimuth and 8 degrees in elevation. The 8-degree vertical extent of the beam is roughly 140 mrads, which relates to 14, 10 mrad pixels. The effective power per pixel is 20 W/14 or 1.4 W. For the first calculation it is assumed that the target fills the extent of a single pixel. The integration count has been reduced to 16 to increase the full frame scan time required to cover eight degrees in azimuth.

Baseline: 15-meters range @ (0.35Watts, 230 um detector, 512 integration count, 90% reflective target)

the Effective system:(1.4 W, 5000 um detector, 16 integration count, 90% reflective) solve for count. Range scales with the square root of power, and linearly with effective receiver aperture. Range=sqrt (1.4/0.35)*(5000/230)*(16/512)¼*15=274 meters.

The effective target size at 274 m is 2.74 m. We can extrapolate the range to a 1-meter target. The Maximum range with a 1-meter target is thus 274*sqrt (1/2.74)=206 meters.

Example #4—Long range scan, 24-degree vertical field. It is assumed the sensor has the approximate location of a target travelling within a region 24 degrees azimuth and 24 degrees in elevation. The 24-degree vertical extent of the beam is roughly 445 mrads, which relates to 44, 10 mrad pixels. The effective power per pixel is 20 W/44 or 0.45 W. For the first calculation, assume the target fills the extent of a single pixel. The integration count has been reduced to 2 to increase the full frame scan time required to cover 24 degrees in azimuth.

Baseline: 15-meters range @ (0.35Watts, 230 um detector, 512 integration count, 90% reflective target)

The Effective system: (0.45 W, 5000 um detector, 16 integration count, 90% reflective) solve for count. Range scales with the square root of power, and linearly with effective receiver aperture.

Range=sqrt (0.45/0.35)*(5000/230)*(2/512)1/4*15=92 meters.

The range to a 1-meter target is the same, since a 1-meter target is larger than the individual pixel coverage.

Example #5—Track Scan—Baseball ball zone crossing detection.

A scanning module is placed roughly 20 meters off-axis (66 feet) from a line connecting the pitching mound and home plate. An eight-degree vertical fan beam detection region 8 feet tall is established to detect the travelling ball soon after pitcher release. The field-of-view per square pixel is 10-milliradians and thus 14 pixels are required to cover the full vertical field. The unit is adjusted to place the center of the scanned region in the center of the travel of the ball. The time per scan needs to be enough to obtain at least one solid target detection of a 90 mph (130 ft/sec) fastball crossing the 10 milliradian azimuth extent of the scan zone. The 10 milliradian zone at 20 meters is 0.2 meter or ⅔ foot. The ball is roughly 2.9 inches in diameter, so the crossing time is 4.3 milliseconds based on the effective distance traveled while the ball is completely contained in the receiver field. The transmit burst period is 100 microseconds, so we obtain a maximum integration count per pixels of 50/14 or 3.

Calculation of maximum range assuming a very large target, an 8-degree vertical extent transmit fan beam and 512 integration count. From example #3 an 8-degree beam gives the power per pixel of 1.4 W. Range=sqrt (1.4 W/0.35 W)*(5000 um/230 um)*15=650 meters.

The target size @650 m would be 6.5 meters across.

The equivalent size of the baseball sqrt (3.14* (0.067 m/2)2)=0.059 m (equivalent square field.)

The extrapolated range to a 0.059-meter target is 650 *sqrt (0.059/6.5) or 61 meters. Since the ball is still smaller than the pixel field of view, The range scales on the 6th root of integration count. We can now solve the integration count by Required integration count is 512/(61 m/20 m)^6=0.7 acquisitions or roughly 1

Required Integration Count for tracking to the plate.

Scan time is 100 usec*14 or 1.4 msec and since the ball takes 4.3 milliseconds to cross the zone, we will get a minimum of 3 measurement as it crosses.

Angular rate at a perpendicular orientation to the ball. From a vantage point 66 feet (20 meters) on a perpendicular to a ball traveling at 130 ft/sec (90 mph), the ball will travel 1.3 feet in an arbitrary interval of 10 milliseconds. The angular rate is tan−1(1.3/66)*100 or 112 degrees/sec in azimuth. The maximum rotation rate of the platform is 720 degrees/second (2 Hz rotation rate) so the angular tracking rate is well within the capabilities of the sensor.

Example #6—Ball track after detection. Once the approximate location of the ball is identified the unit can switch to tracking mode which would establish a tracking window consisting of a 10 mrad square field with subpixels 5 mrads square or less based on tracking accuracy requirements. With only 1 acquisition required per pixel dwell, the effective update rate is 2500 Hz. Tracking accuracy should be accurate to under 1 inch in azimuth, elevation and range.

Having thus described various embodiments of the technology, what is claimed as new and desired to be protected by Letters Patent includes the following:

1. An electronic scanning system for wide-range scanning of objects in three-dimensions comprising:
   a broad-beam, laser-based transmitter adapted to generate a scanning signal to be transmitted in a scanning direction toward an object to be scanned, a received portion of the scanning signal being reflected by the object to be scanned;
   a receiver channel primary collection lens adapted to receive the received portion of the scanning signal and to direct the received portion of the scanning signal to an electronically-controllable mirror array, the mirror array adapted to selectively direct a directed portion of the reflected scanning signal;
   at least one detector lens adapted to receive the directed portion of the reflected scanning signal, the detector lens adapted to focus the directed scanning signal resulting in a focused directed signal;
   at least one photoelectric detector adapted to convert the focused directed scanning signal into at least one electronic representation of a two-dimensional image; and
   a positional rotation stage adapted to rotate the system with respect to the object to be scanned.

2. The system of claim 1, wherein the photoelectric detector is an avalanche photodiode (APD).

3. The system of claim 1, wherein the mirror array is a digital light processing (DLP) micro-electromechanical system (MEMS) mirror array.

4. The system of claim 1, wherein the broad-beam, laser-based transmitter is a surface mount 905 nm pulsed semiconductor laser.

5. The system of claim 1 further comprising:
   at least one receiver channel focusing lens adapted to focus light at a selected portion of the mirror array.

6. The system of claim 5 further comprising:
   at least one field lens adapted to direct the received portion of the scanning signal to the mirror array.

7. The system of claim 6 further comprising:
   at least one field-channel selection slice adapted to selectively direct at least one portion of the received portion of the scanning signal to the at least one photoelectric detector.

8. The system of claim 7 further comprising:
   at least one field dissecting prism adapted to direct a field-selected portion of the received portion of the scanning signal to the at least one field-channel selection slice.

9. The system of claim 8 further comprising:
   at least one folding mirror to re-direct the field-selected portion of the scanning signal to the at least one photoelectric detector, resulting in a re-directed, field-selected portion of the scanning signal to the at least one photoelectric detector.

10. The system of claim 9 further comprising:
    at least one detector channel focusing lens adapted to focus the re-directed, field-selected portion of the scanning signal at the at least one photoelectric detector.

11. An electronic scanning system for wide-range scanning of objects in three-dimensions comprising:
    a broad-beam, laser-based transmitter adapted to generate a scanning signal to be transmitted in a scanning direction toward an object to be scanned, a received portion of the scanning signal being reflected by the object to be scanned;
    a receiver channel primary collection lens adapted to receive the received portion of the scanning signal and to direct the received portion of the scanning signal to an electronically-controllable mirror array, the mirror array adapted to selectively direct a directed portion of the reflected scanning signal;
    at least one detector lens adapted to receive the directed portion of the reflected scanning signal, the detector lens adapted to focus the directed scanning signal resulting in a focused directed signal;
    at least one photoelectric detector adapted to convert the focused directed scanning signal into at least one electronic representation of a two-dimensional image;
    at least one field lens adapted to direct the received portion of the scanning signal to the mirror array;
    at least one field-channel selection slice adapted to selectively direct at least one portion of the received portion of the scanning signal to the at least one photoelectric detector.
    at least one field dissecting prism adapted to direct a field-selected portion of the received portion of the scanning signal to the at least one field-channel selection slice;
    at least one folding mirror to re-direct field-selected portion of the scanning signal to the at least one photoelectric detector, resulting in a re-directed, field-selected portion of the scanning signal to the at least one photoelectric detector;
    at least one detector channel focusing lens adapted to focus the re-directed, field-selected portion of the scanning signal at the at least one photoelectric detector; and
    a positional rotation stage adapted to rotate the system with respect to the object to be scanned.

12. The system of claim 11, wherein the photoelectric detector is an avalanche photodiode (APD).

13. The system of claim 11, The system of claim 1, wherein the mirror array is a digital light processing (DLP) micro-electromechanical system (MEMS) mirror array.

14. The system of claim 11, wherein the broad-beam, laser-based transmitter is a surface mount 905 nm pulsed semiconductor laser.

15. A three-dimensional electronic scanning system for wide-range scanning of objects in three-dimensions comprising:
    a broad-beam, pulsed semiconductor laser adapted to generate a scanning signal to be transmitted, through a transmit lens assembly, in a scanning direction toward an object to be scanned, a received portion of the scanning signal being reflected by the object to be scanned;
    a receiver channel primary collection lens adapted to receive the received portion of the scanning signal and to direct the received portion of the scanning signal to a digital light processing (DLP) micro-electromechanical system (MEMS) mirror array, the mirror array adapted to selectively direct a directed portion of the reflected scanning signal;
    at least three detector lenses adapted to receive the directed portion of the reflected scanning signal, the detector lens adapted to focus the directed scanning signal resulting in a focused directed signal;
    at least three avalanche photo diodes adapted to convert the focused directed scanning signal into at least one electronic representation of a two-dimensional image;
    at least three field lenses adapted to direct the focused directed signal to a selected portion of the mirror array;
    at least three field-channel selection slices adapted to selectively direct a corresponding portion of the received portion of the scanning signal to a corresponding one of the at least three avalanche photo diodes;

at least one field dissecting prism adapted to direct a field-selected portion of the received portion of the scanning signal to the at least one field-channel selection slice;

at least three folding mirrors to re-direct field-selected portion of the scanning signal to the at least three avalanche photo diodes, resulting in re-directed, field-selected portions of the scanning signal a corresponding one of the at least three avalanche photo diodes;

at least three detector channel focusing lenses adapted to focus the re-directed, field-selected portion of the scanning signal at the at least three avalanche photo diodes; and a positional rotation stage adapted to rotate the system with respect to the object to be scanned.

16. The system of claim 15, wherein the avalanche photodiodes have a detection radius of no more than 5 mm.

17. The system of claim 15, wherein the broad-beam, pulsed semiconductor laser is a surface mount 905 nm pulsed semiconductor laser.

18. The system of claim 15, wherein the positional rotation stage comprises a piezoelectric motor.

19. The system of claim 18, wherein the piezoelectric motor is adapted to perform a full 360-degree azimuth rotation.

20. The system of claim 19, wherein the piezoelectric motor is adapted to rotate 180-degrees in either direction.

\* \* \* \* \*